(12) United States Patent
Hoshi

(10) Patent No.: US 10,217,858 B2
(45) Date of Patent: Feb. 26, 2019

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Yasuyuki Hoshi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 227 days.

(21) Appl. No.: 15/291,322

(22) Filed: Oct. 12, 2016

(65) Prior Publication Data

US 2017/0141223 A1 May 18, 2017

(30) Foreign Application Priority Data

Nov. 16, 2015 (JP) .................................. 2015-223774

(51) Int. Cl.
*H01L 29/06* (2006.01)
*H01L 29/66* (2006.01)
(Continued)

(52) U.S. Cl.
CPC ...... *H01L 29/7813* (2013.01); *H01L 29/0865* (2013.01); *H01L 29/1079* (2013.01); *H01L 29/1608* (2013.01); *H01L 29/36* (2013.01); *H01L 29/41741* (2013.01); *H01L 29/4236* (2013.01); *H01L 29/66068* (2013.01); *H01L 29/66666* (2013.01); *H01L 29/66734* (2013.01); *H01L 29/0623* (2013.01);
(Continued)

(58) Field of Classification Search
CPC ............. H01L 29/0623; H01L 29/7813; H01L 29/1095; H01L 29/0878; H01L 29/0882; H01L 29/41741; H01L 29/4236; H01L 29/7827; H01L 29/66666; H01L 29/1608; H01L 21/02378; H01L 21/02529; H01L 29/6666; H01L 29/0886
See application file for complete search history.

(56) References Cited

U.S. PATENT DOCUMENTS 6,180,958 B1 1/2001 Cooper, Jr.
7,825,449 B2 11/2010 Suzuki et al.
(Continued)

FOREIGN PATENT DOCUMENTS

JP 2009-117593 A 5/2009
JP 2009-260253 A 11/2009
(Continued)

*Primary Examiner* — William F Kraig
*Assistant Examiner* — Khatib A Rahman
(74) *Attorney, Agent, or Firm* — Chen Yoshimura LLP

(57) ABSTRACT

Trenches and n⁺ high impurity concentration regions are formed in a first principal surface side of a silicon carbide semiconductor substrate. In the n⁺ high impurity concentration regions, third n-type regions that respectively surround first p⁺ base regions contacting a p-type base layer and have a higher impurity concentration than the n⁺ high impurity concentration regions, as well as fourth n-type regions that respectively surround second p⁺ base regions formed at the bottoms of the trenches and also have a higher impurity concentration than the n⁺ high impurity concentration regions, are formed.

10 Claims, 11 Drawing Sheets

(51) Int. Cl.
  *H01L 29/36* (2006.01)
  *H01L 29/78* (2006.01)
  *H01L 29/10* (2006.01)
  *H01L 29/08* (2006.01)
  *H01L 29/417* (2006.01)
  *H01L 29/423* (2006.01)
  *H01L 29/16* (2006.01)

(52) U.S. Cl.
  CPC ...... *H01L 29/0878* (2013.01); *H01L 29/0882* (2013.01); *H01L 29/0886* (2013.01); *H01L 29/1095* (2013.01)

(56) References Cited

U.S. PATENT DOCUMENTS

| | | |
|---|---|---|
| 8,283,721 B2 | 10/2012 | Nakano |
| 8,525,254 B2 | 9/2013 | Treu et al. |
| 9,136,322 B2 | 9/2015 | Nakano et al. |
| 9,425,261 B2 * | 8/2016 | Fukui ............... H01L 29/0623 |
| 2016/0247910 A1 * | 8/2016 | Suzuki ............. H01L 29/66068 |

FOREIGN PATENT DOCUMENTS

| | | |
|---|---|---|
| JP | 2012-178536 A | 9/2012 |
| JP | 5539931 B2 | 7/2014 |

* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

In conventional power semiconductor devices, vertical metal-oxide-semiconductor field-effect transistors (MOSFETs) that have a trench structure are manufactured to reduce the on-resistance of the device. In vertical MOSFETs, a trench structure in which a channel is formed orthogonal to the substrate surface makes it possible to achieve a higher cell density per unit area than a planar structure in which a channel is formed parallel to the substrate surface. This makes it possible to increase the current density per unit area and is advantageous from a cost perspective.

However, when a trench structure is formed in a vertical MOSFET, the inner walls of the trench structure are entirely covered by a gate insulating film so that the channel can be formed in the vertical direction, and the portion of the gate insulating film at the bottom of the trench is positioned near the drain electrode. As a result, the portion of the gate insulating film at the bottom of the trench tends to be subjected to strong electric fields. Particularly in the ultra-high breakdown voltage devices manufactured using wide-bandgap semiconductors (semiconductors that have a wider bandgap than silicon, such as silicon carbide (SiC)), the negative effects on the gate insulating film at the bottom of the trench can significantly decrease the reliability of a vertical MOSFET.

One proposed solution to this problem is a structure in which a p-type region that contacts a p-type base region is formed extending down to a position deeper than the bottom of the trench and the p-n junction is formed at a position deeper than the bottom of the trench in order to decrease the magnitude of the electric field at the bottom of the trench (see Patent Document 1, for example). Structures in which a p-type region is formed at the bottom of the trench have also been proposed (see Patent Document 2, for example). Still another proposed solution is a structure that combines both the structure in which a p-type region that contacts a p-type base region is formed extending down to a position deeper than the bottom of the trench and the p-n junction is formed at a position deeper than the bottom of the trench and the structure in which a p-type region is formed at the bottom of the trench (see Patent Document 3, for example).

RELATED ART DOCUMENTS

Patent Documents

Patent Document 1: Japanese Patent No. 5539931
Patent Document 2: U.S. Pat. No. 6,180,958
Patent Document 3: Japanese Patent Application Laid-Open Publication No. 2009-260253

SUMMARY OF THE INVENTION

However, when the p-n junction is formed using the technology disclosed in Patent Document 1, a sufficient breakdown voltage cannot be achieved unless the p-n junction is formed at a position deeper than the bottom of the trench or a position near the trench, which makes manufacturing extremely difficult. Moreover, when a p-type region is formed using the technology disclosed in Patent Document 2, the gate insulating film on the sidewalls of the trench tends to get subjected to strong electric fields, and the current path becomes narrow in the ON state, which increases the on-resistance. Furthermore, when both a deep p-type structure is formed at a position away from the trench and a p-type region is formed at the bottom of the trench using the technology disclosed in Patent Document 3, the width of the p-type region at the bottom of the trench is made narrower than the width of the trench in order to reduce the on-resistance. As a result, the magnitude of the strong electric field is not reduced at the corners at the bottom of the trench. In addition, in Patent Document 3, a wide p-n junction is formed in the region directly beneath the trench (on the drain side), and therefore the breakdown voltage of the active portion through which current flows when the semiconductor device is in the ON state increases to near the performance limits of wide-bandgap semiconductors. As a result, the breakdown voltage of the active portion tends to become higher than the breakdown voltage of a breakdown structure that maintains the breakdown voltage of the device by reducing the magnitude of the electric field on the substrate front surface side of a drift layer formed surrounding the periphery of the active portion. This can potentially decrease the withstand capability of the device. Moreover, this structure also tends to increase the on-resistance of the device.

The present invention was made to solve such problems in the conventional technologies described above and aims to provide a semiconductor device that can be formed easily, reduces the breakdown voltage of the active portion in order to make it easier to design the breakdown voltage of the breakdown structure, and exhibits decreased on-resistance, as well as a method of manufacturing such a semiconductor device. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a wide-bandgap semiconductor substrate of a first conductivity type made of a semiconductor having a wider bandgap than silicon; a wide-bandgap semiconductor layer of the first conductivity type that is formed on a front surface of the wide-bandgap semiconductor substrate and that is made of a semiconductor having a wider bandgap than silicon, the wide-bandgap semiconductor layer having a lower impurity concentration than the wide-bandgap semiconductor substrate; a first base region of a second conductivity type that is selectively formed in a surface layer of the wide-bandgap semiconductor layer of the first conductivity type on a side opposite to the wide-bandgap semiconductor substrate; a second base region of the second conductivity type that is selectively formed inside the wide-bandgap semiconductor layer of the first conductivity type; a first region of the first conductivity type that is selectively formed in the surface layer of the wide-bandgap semiconductor layer of the first conductivity type on the side opposite to the wide-bandgap semiconductor substrate and that has a higher impurity concentration than the wide-bandgap semiconductor layer of the first conductivity type, the first region being located between the first base region and the second base region; a wide-bandgap semiconductor layer of the second conductivity type that is made of a semiconductor having a wider bandgap than silicon and that is formed on a surface of the wide-bandgap semiconductor layer of the first conductivity type opposite to the wide-bandgap semiconductor substrate; a source region of the first conductivity type that is selectively formed in the surface of the wide-bandgap semiconductor layer of the second conductivity type; a trench that goes through the source region and the wide-bandgap semiconductor layer of the second conductivity type, the trench reaching the first region and the second base region in the wide-bandgap semiconductor layer of the first conductivity type so that the second base region is at a bottom of the trench; a gate electrode formed inside the trench with a gate insulating film interposed therebetween; a source electrode that contacts the source region and the wide-bandgap semiconductor layer of the second conductivity type; and a drain electrode formed on a rear surface of the wide-bandgap semiconductor substrate, wherein the first base region is electrically connected to the second base region, and wherein a second region of the first conductivity type and a third region of the first conductivity type, each having a higher impurity concentration than the first region, are selectively formed in the wide-bandgap semiconductor layer of the first conductivity type such that the second region partially surrounds the second base region, and the third region partially surrounds the first base region.

Moreover, in the semiconductor device according to one aspect of the present invention as described above, a width of the second base region may be greater than a width of the trench.

Furthermore, in the semiconductor device according to one aspect of the present invention as described above, the second base region and the second region may be formed not contacting the trench.

In addition, in the semiconductor device according to one aspect of the present invention as described above, the first region may extend between the wide-bandgap semiconductor layer of the second conductivity type and a section connecting the first base region to the second base region.

Moreover, in the semiconductor device according to one aspect of the present invention as described above, a section connecting a portion of the first base region to the second base region may sandwich the first region and may have a planar layout in which the section is periodically arranged in a direction orthogonal to a direction in which the first base region and the second base region are arranged.

Furthermore, in the semiconductor device according to one aspect of the present invention as described above, at least a portion of an end of the first base region on a side of the drain electrode may be positioned further towards the drain electrode than an end of the second base region on the side of the drain electrode.

In addition, in the semiconductor device according to one aspect of the present invention as described above, a portion of an end of the first base region on a side of the drain electrode that is deeper than an end of the second base region on the side of the drain electrode may have a planar layout in which the portion is periodically arranged in a direction orthogonal to a direction in which the first base region and the second base region are arranged.

Moreover, in the semiconductor device according to one aspect of the present invention as described above, the semiconductor having a wider bandgap than silicon may be silicon carbide.

In another aspect, the present disclosure provides a method of manufacturing a semiconductor device, including: forming, on a front surface of a wide-bandgap semiconductor substrate of a first conductivity type made of a semiconductor having a wider bandgap than silicon, a wide-bandgap semiconductor layer of the first conductivity type that has a lower impurity concentration than the wide-bandgap semiconductor substrate; selectively forming, in a surface layer of the wide-bandgap semiconductor layer of the first conductivity type on a side opposite to the wide-bandgap semiconductor substrate, a first region of the first conductivity type that has a higher impurity concentration than the wide-bandgap semiconductor layer of the first conductivity type; selectively forming, in the surface layer of the wide-bandgap semiconductor layer of the first conductivity type, a first base region of a second conductivity type, a second base region of the second conductivity type, a third region of the first conductivity type that partially surrounds the first base region, and a second region of the first conductivity type that partially surrounds the second base region; forming, on a surface of the wide-bandgap semiconductor layer of the first conductivity type opposite to the wide-bandgap semiconductor substrate, a wide-bandgap semiconductor layer of the second conductivity type that is made of a semiconductor having a wider bandgap than silicon; selectively forming a source region of the first conductivity type in the surface of the wide-bandgap semiconductor layer of the second conductivity type; forming, at a position facing the second base region of the second conductivity type in a depth direction, a trench that goes through the source region of the first conductivity type and the wide-bandgap semiconductor layer of the second conductivity type to reach the first region and the second base region in the wide-bandgap semiconductor layer of the first conductivity type so that the second base region is at a bottom of the trench; forming a gate electrode inside the trench with a gate insulating film interposed therebetween; forming a source electrode that contacts the wide-bandgap semiconductor layer of the second conductivity type and the source region of the first conductivity type; and forming a drain electrode on a rear surface of the wide-bandgap semiconductor substrate.

Moreover, in the method of manufacturing the semiconductor device as described above, in one aspect, a surface portion of the first region on a side opposite to the wide-bandgap semiconductor substrate may be formed by being epitaxially grown.

In the invention described above, the second region partially surrounds the second base region, and the third region partially surrounds the first base region. This makes it possible to make the concentration of n-type impurities in the portion (hereinafter, a "JFET region") of the high impurity concentration n-type drift layer that is sandwiched between the first base region and the second base region relatively high in comparison to other portions of the high impurity concentration n-type drift layer. This, in turn, makes it possible to reduce the resistance component from the JFET region, thereby making it possible to reduce the overall on-resistance.

The semiconductor device and method of manufacturing the semiconductor device according to the present invention make it possible to easily form the semiconductor device, reduce the breakdown voltage of the active portion in order to make it easier to design the breakdown voltage of the breakdown structure, and make it possible to decrease the on-resistance of the device.

It is to be understood that both the foregoing general description and the following detailed description are exemplary and explanatory, and are intended to provide further explanation of the invention as claimed.

DETAILED DESCRIPTION OF EMBODIMENTS

Figure 1:
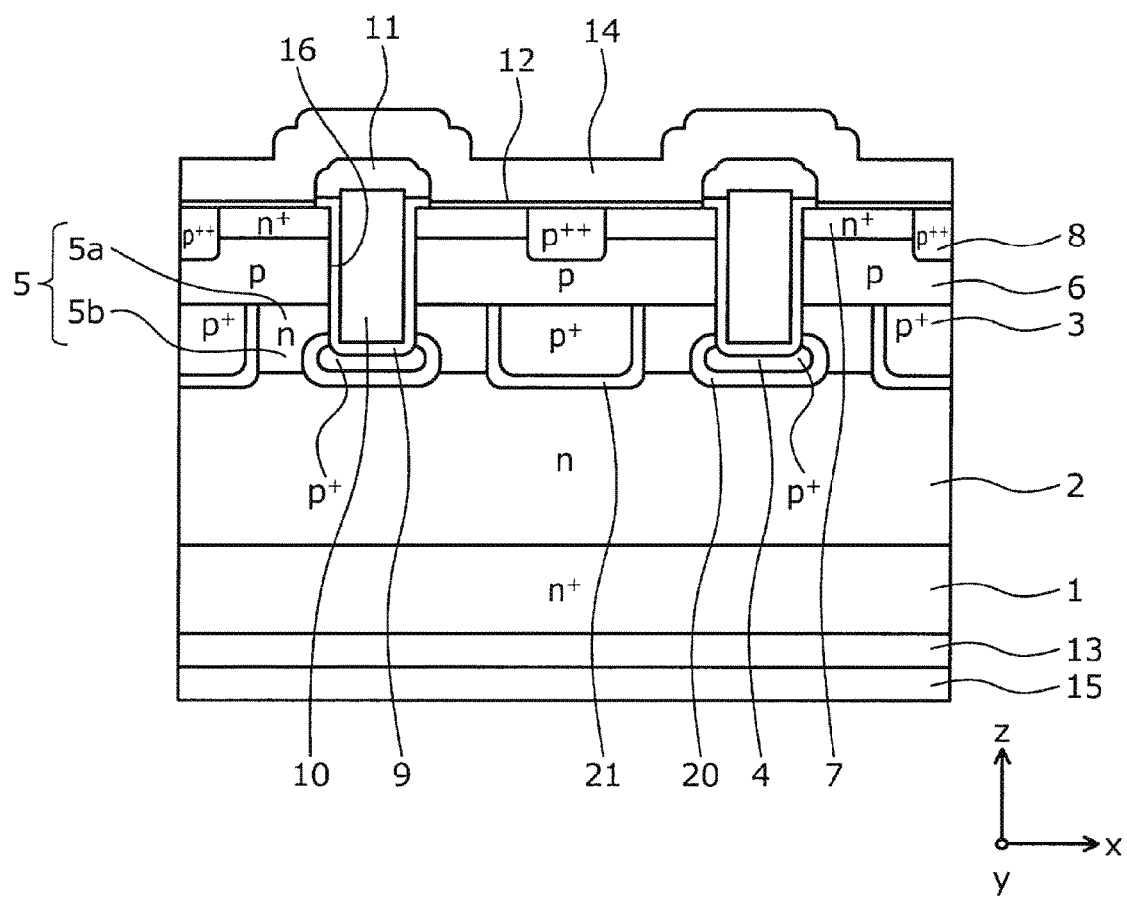
FIG. 1 is a cross-sectional view illustrating a configuration of a silicon carbide semiconductor device according to Embodiment 1.

Preferred embodiments of a semiconductor device and a method of manufacturing the semiconductor device according to the present invention will be described in detail below with reference to figures. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower impurity concentration, respectively, than layers or regions not labeled with the + or − symbols. Layers and regions that are labeled with the same n and p (and + and −) notation have approximately the same impurity concentration but are not limited to having exactly the same impurity concentration. In the descriptions of the embodiments and figures, the same reference characters are used to indicate components that are the same, and duplicate descriptions of the same components are omitted. Moreover, the following notation is used for Miller indices in the present specification: the symbol—indicates a bar to be applied to the index that follows the—symbol; that is, the symbol—is inserted before an index to indicate that that index is negative.

Embodiment 1

The semiconductor device according to one aspect of the present invention is formed using a wide-bandgap semiconductor. In the present embodiment, a silicon carbide semiconductor device manufactured using silicon carbide (SiC) as the wide-bandgap semiconductor, for example, will be described using a MOSFET as an example. FIG. 1 is a cross-sectional view illustrating a configuration of the silicon carbide semiconductor device according to Embodiment 1.

As illustrated in FIG. 1, in the silicon carbide semiconductor device according to the present embodiment, an n-type silicon carbide epitaxial layer (a first wide-bandgap semiconductor layer of a first conductivity type) 2 is deposited onto a first principal surface (the front surface; here, the (0001) plane (Si plane), for example) of an $n^+$ silicon carbide substrate (a wide-bandgap semiconductor substrate of the first conductivity type) 1.

The $n^+$ silicon carbide substrate 1 is a monocrystalline silicon carbide substrate doped with nitrogen (N), for example. The n-type silicon carbide epitaxial layer 2 is a low impurity concentration n-type drift layer doped with nitrogen, for example, and has a lower impurity concentration than the $n^+$ silicon carbide substrate 1. $n^+$ high impurity concentration regions (first regions of the first conductivity type) 5 are formed on the surface opposite to the $n^+$ silicon carbide substrate 1 side of the n-type silicon carbide epitaxial layer 2. The $n^+$ high impurity concentration regions 5 are a high impurity concentration n-type drift layer doped with nitrogen, for example, and have a lower impurity concentration than the $n^+$ silicon carbide substrate 1 but a higher impurity concentration than the n-type silicon carbide epitaxial layer 2. In the following description, the $n^+$ silicon carbide substrate 1, the n-type silicon carbide epitaxial layer 2, and a p-type base layer (a wide-bandgap semiconductor layer of a second conductivity type) 6 (described later) will be referred to collectively as a "silicon carbide semiconductor substrate".

A rear surface electrode (a drain electrode) 13 is formed on the second principal surface of the $n^+$ silicon carbide substrate 1 (the rear surface; that is, the rear surface of the silicon carbide semiconductor substrate). The rear surface electrode 13 functions as a drain electrode. A drain electrode pad 15 is formed on the surface of the rear surface electrode 13.

Trench gate structures are formed on the first principal surface side (the p-type base layer 6 side) of the silicon carbide semiconductor substrate. More specifically, trenches 16 are formed going from the surface opposite to the $n^+$ silicon carbide substrate 1 side of the p-type base layer 6 (that is, the first principal surface side of the silicon carbide semiconductor substrate) down through the p-type base layer 6 and into the $n^+$ high impurity concentration regions 5. A gate insulating film 9 is formed along the inner walls of each trench 16 (that is, on the bottom and the sidewalls of the trench 16), and a gate electrode 10 is formed on the inner side of the gate insulating film 9 inside each trench 16. The gate electrode 10 is insulated from the n-type silicon carbide epitaxial layer 2 and the p-type base layer 6 by the gate insulating film 9. A portion of the gate electrode 10 may protrude upward from the top of the trench 16 (that is, on a source electrode pad 14 side) towards the source electrode pad 14 side.

First p+ base regions (first base regions of the second conductivity type) 3, second p+ base regions (second base regions of the second conductivity type) 4, third n-type regions (second regions of the first conductivity type) 20, and fourth n-type regions (third regions of the first conductivity type) 21 are selectively formed in the surface layer of the n-type silicon carbide epitaxial layer 2 on a side opposite to the n+ silicon carbide substrate 1 side (that is, on the first principal surface side of the silicon carbide semiconductor substrate). The first p+ base regions 3 extend down to a deeper position on the drain side than the bottoms of the trenches 16. The bottom end (that is, the drain-side end) of each first p+ base region 3 is positioned further towards the drain side than the bottoms of the trenches 16. The bottom end of each second p+ base region 4 is also positioned further towards the drain side than the bottoms of the trenches 16. The second p+ base regions 4 are formed at positions that face the bottoms of the trenches 16 in the depth direction (the z direction). The width of the second p+ base regions 4 is greater than the width of the trenches 16. The bottoms of the trenches 16 may extend into the second p+ base regions 4 or may be positioned in the n+ high impurity concentration regions 5 that are sandwiched between the p-type base layer 6 and the second p+ base regions 4 without contacting the second p+ base regions 4. The first p+ base regions 3 and the second p+ base regions 4 are doped with aluminum (Al), for example.

The third n-type regions 20 and the fourth n-type regions 21 are high impurity concentration n-type drift layers doped with nitrogen, for example, and have a higher impurity concentration than the n+ high impurity concentration regions 5. Each third n-type region 20 partially surrounds the respective second p+ base region 4. More specifically, the third n-type regions 20 are formed on the surfaces of the second p+ base regions 4 that face the n-type silicon carbide epitaxial layer 2 and on the surfaces of the second p+ base regions 4 that face the n+ high impurity concentration regions 5. Furthermore, the fourth n-type regions 21 are formed on the surfaces of the first p+ base regions 3 that face the n-type silicon carbide epitaxial layer 2 and on the surfaces of the first p+ base regions 3 that face the n+ high impurity concentration regions 5. Moreover, the fourth n-type regions 21 may be left unformed on the portions of the surfaces of the first p+ base regions 3 that face the n+ high impurity concentration regions 5 and are positioned near the p-type base layer 6 (described later).

Extending a portion of each first p+ base region 3 towards the trench 16 sides forms a structure in which the first p+ base regions 3 are connected to the second p+ base regions 4. In this case, the first p+ base regions 3 may have a planar layout in which portions of the first p+ base regions 3 are arranged alternately with the n+ high impurity concentration regions 5 in a repeating manner in a direction (the y direction; hereinafter, a "second direction") orthogonal to the direction in which the first p+ base regions 3 and the second p+ base regions 4 are arranged (the x direction; hereinafter, a "first direction"). In other words, portions of the first p+ base regions 3 may be connected to portions of the second p+ base regions 4 in at least one or more locations along the orthogonal y direction. This makes it possible to efficiently divert any holes created due to avalanche breakdown at the junctions between the second p+ base regions 4 and the n-type silicon carbide epitaxial layer 2 to a source electrode 12. This reduces the load on the gate insulating film 9 and improves reliability.

The p-type base layer (a wide-bandgap semiconductor layer of the second conductivity type) 6 is formed on the substrate first principal surface side of the n-type silicon carbide epitaxial layer 2. The p-type base layer 6 contacts the first p+ base regions 3. The impurity concentration of the p-type base layer 6 may be lower than the impurity concentration of the first p+ base regions 3, for example. This inhibits widening of the depletion layer in the p-type base layer 6, thereby making it possible to avoid a decrease in breakdown voltage due to punchthrough even when the impurity concentration of the p-type base layer 6 is decreased in order to decrease the threshold voltage. n+ source regions (source regions of the first conductivity type) 7 and p++ contact regions (contact regions of the second conductivity type) 8 are selectively formed in the substrate first principal surface side of the p-type base layer 6. Moreover, the n+ source regions 7 and the p++ contact regions 8 contact one another. Furthermore, the n+ high impurity concentration regions 5 are formed in the surface layer on the substrate first principal surface side of the n-type silicon carbide epitaxial layer 2; specifically, in regions of the surface layer that is sandwiched between the first p+ base regions 3 and the second p+ base regions 4 and in a region of the surface layer that is sandwiched between the p-type base layer 6 and the second p+ base regions 4.

FIG. 1 only depicts two of the trench-MOS structures. However, more of these trench-MOS gate (metal-oxide-semiconductor insulated gate) structures may be arranged in parallel.

An interlayer insulating film 11 is formed over the entire first principal surface side of the silicon carbide semiconductor substrate and covers the gate electrodes 10 buried in the trenches 16. The source electrode 12 contacts the n+ source regions 7 and the p++ contact regions 8 via contact holes formed in the interlayer insulating film 11. The source electrode 12 is electrically insulated from the gate electrodes 10 by the interlayer insulating film 11. The source electrode pad 14 is formed on top of the source electrode 12.

Method of Manufacturing Silicon Carbide Semiconductor Device According to Embodiment 1

Next, a method of manufacturing the silicon carbide semiconductor device according to Embodiment 1 will be described. FIGS. 2 to 7 are cross-sectional views schematically illustrating states during the manufacture of the silicon carbide semiconductor device according to Embodiment 1.

Figure 2:
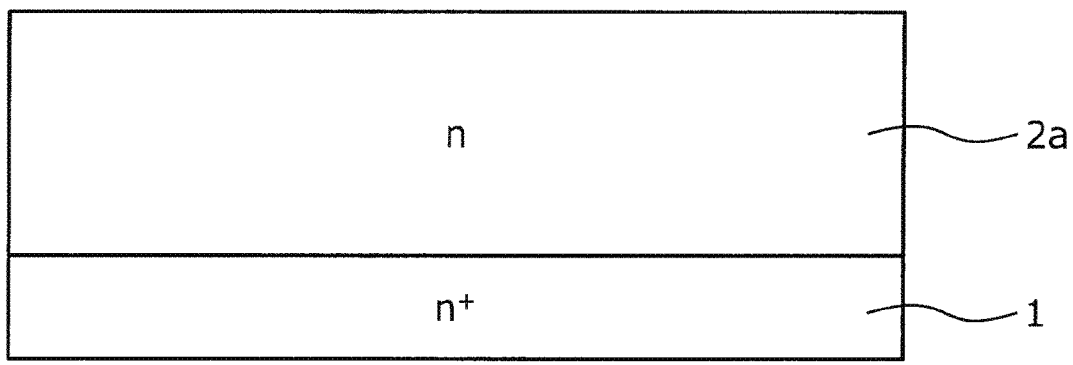
FIG. 2 is a cross-sectional view schematically illustrating a (first) state during the manufacture of the silicon carbide semiconductor device according to Embodiment 1.

First, an n+ silicon carbide substrate 1 made of n-type silicon carbide is prepared. Then, a first n-type silicon carbide epitaxial layer (a first wide-bandgap semiconductor layer of a first conductivity type) 2a made of silicon carbide is epitaxially grown to a thickness of approximately 30 μm, for example, on the first principal surface of the n+ silicon carbide substrate 1 while doping with n-type impurities such as nitrogen atoms, for example. This first n-type silicon carbide epitaxial layer 2a functions as an n-type silicon carbide epitaxial layer 2. FIG. 2 illustrates the state of the device up to this point.

Next, a mask (not illustrated in the figure) that is made of an oxide film, for example, and has the desired openings formed therein using a photolithography technology is formed on the surface of the first n-type silicon carbide epitaxial layer 2a. Then, using an ion implantation method with the oxide film being used as a mask, n-type impurities such as phosphorus (P) atoms are ion-implanted. In this way, first third n-type regions 20a and first fourth n-type regions 21a are formed in portions of the surface region of the first n-type silicon carbide epitaxial layer 2a.

Next, the mask used during the ion implantation process for forming the first third n-type regions 20a and the first fourth n-type regions 21a is removed. Then, a mask (not illustrated in the figure) that is made of an oxide film, for example, and has the desired openings formed therein using a photolithography technology is formed on the surface of the first n-type silicon carbide epitaxial layer 2a. Next, using an ion implantation method with the oxide film being used as a mask, p-type impurities such as aluminum atoms are ion-implanted. In this way, portions of the first third n-type regions 20a and the first fourth n-type regions 21a are selectively inverted to p-type regions to form first p-type regions (first base regions of a second conductivity type) 3a and second p⁺ base regions (second base regions of the second conductivity type) 4. The first p-type regions 3a and the second p⁺ base regions 4 are both approximately 0.5 µm in depth, for example. Moreover, the distance between the adjacent first p-type regions 3a and the second p⁺ base regions 4 is approximately 1.5 µm, for example.

Next, the mask used during the ion implantation process for forming the first p-type regions 3a and the second p⁺ base regions 4 is removed. Then, a mask (not illustrated in the figure) that is made of an oxide film, for example, and has the desired openings formed therein using a photolithography technology is formed on the surface of the first n-type silicon carbide epitaxial layer 2a. Next, using an ion implantation method with the oxide film being used as a mask, n-type impurities such as phosphorus atoms are ion-implanted. In this way, second third n-type regions 20b that contact the first third n-type regions 20a are formed in the surface regions of the second p⁺ base regions 4. Together, the second third n-type regions 20b and the first third n-type regions 20a form third n-type regions (second regions of the first conductivity type) 20.

The dose used during the ion implantation process for forming the first p-type regions 3a and the second p⁺ base regions 4 may be set such that the resulting impurity concentration is approximately $5 \times 10^{18}/cm^3$, for example. The dose used during the ion implantation process for forming the first and second third n-type regions 20a and 20b and the first fourth n-type regions 21a may also be set such that the resulting impurity concentration is approximately $5 \times 10^{18}/cm^3$, for example.

Figure 3:
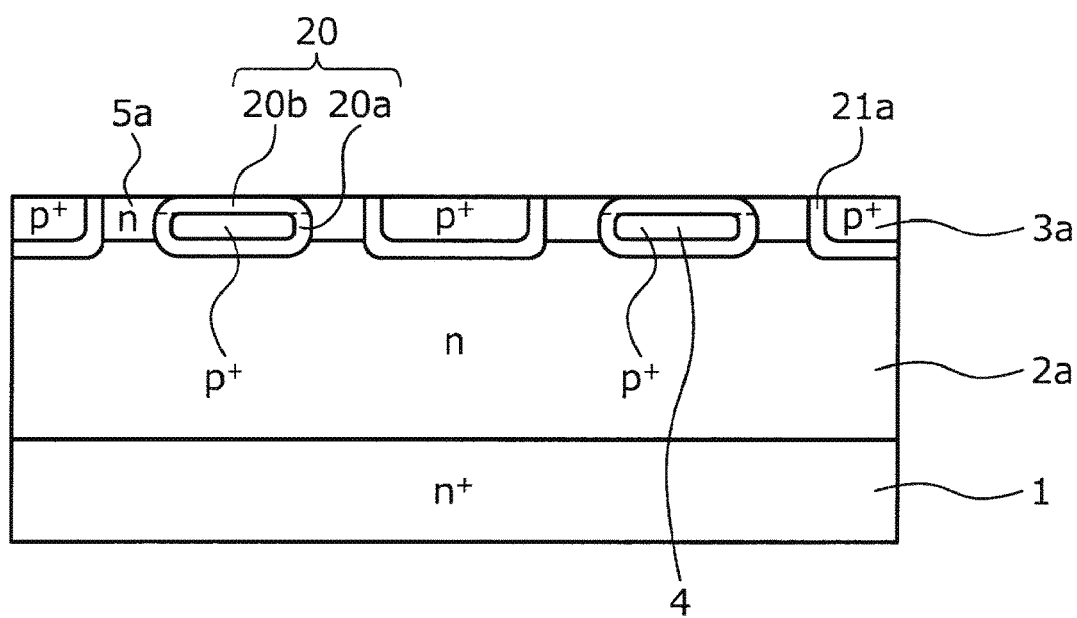
FIG. 3 is a cross-sectional view schematically illustrating a (second) state during the manufacture of the silicon carbide semiconductor device according to Embodiment 1.

Next, the mask used during the ion implantation process for forming the second third n-type regions 20b is removed. Then, using ion implantation, n-type impurities such as nitrogen atoms are ion-implanted. In this way, first n-type regions 5a with a depth of less than or equal to approximately 0.5 µm, for example, are formed between the first p-type regions 3a and the second p⁺ base regions 4 in the surface layer of the first n-type silicon carbide epitaxial layer 2a. The dose used during the ion implantation process for forming the first n-type regions 5a may be set such that the resulting impurity concentration is approximately $1 \times 10^{17}/cm^3$, for example. FIG. 3 illustrates the state of the device up to this point.

Next, a second n-type silicon carbide epitaxial layer (a second wide-bandgap semiconductor layer of the first conductivity type) 2b is epitaxially grown to a thickness of approximately 0.5 µm, for example, on the surface of the first n-type silicon carbide epitaxial layer 2a while doping with n-type impurities such as nitrogen atoms, for example. Together, the second n-type silicon carbide epitaxial layer 2b and the first n-type silicon carbide epitaxial layer 2a function as the n-type silicon carbide epitaxial layer 2. The epitaxial growth conditions for forming the second n-type silicon carbide epitaxial layer 2b may be set such that the resulting impurity concentration of the second n-type silicon carbide epitaxial layer 2b is approximately $3 \times 10^{15}/cm^3$, for example.

Next, a mask (not illustrated in the figure) that is made of an oxide film, for example, and has the desired openings formed therein using a photolithography technology is formed on the surface of the n-type silicon carbide epitaxial layer 2. Then, using an ion implantation method with the oxide film being used as a mask, n-type impurities such as phosphorus atoms are ion-implanted. In this way, second fourth n-type regions 21b that have a depth of approximately 0.5 µm and lie on top of the first p-type regions 3a, for example, are formed in portions of the surface region of the n-type silicon carbide epitaxial layer 2. The dose used during the ion implantation process for forming the second fourth n-type regions 21b may be set such that the resulting impurity concentration is approximately $5 \times 10^{18}/cm^3$, for example. Together, the second fourth n-type regions 21b and the first fourth n-type regions 21a form fourth n-type regions (third regions of the first conductivity type) 21.

Figure 4:
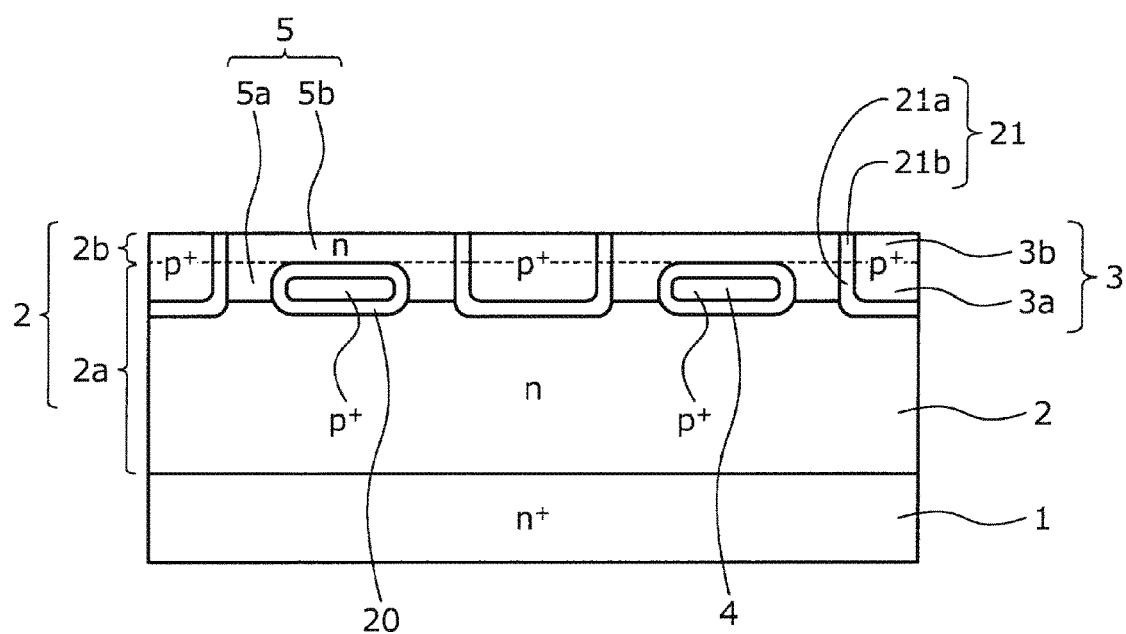
FIG. 4 is a cross-sectional view schematically illustrating a (third) state during the manufacture of the silicon carbide semiconductor device according to Embodiment 1.

Next, the mask used during the ion implantation process for forming the second fourth n-type regions 21b is removed. Then, a mask (not illustrated in the figure) that is made of an oxide film, for example, and has the desired openings formed therein using a photolithography technology is formed on the surface of the n-type silicon carbide epitaxial layer 2. Next, using an ion implantation method with the oxide film being used as a mask, p-type impurities such as aluminum atoms are ion-implanted. In this way, portions of the second fourth n-type regions 21b are selectively inverted to form second p-type regions (third semiconductor regions of the second conductivity type) 3b that have a depth of approximately 0.5 µm and lie on top of the first p-type regions 3a, for example. Together, the second p-type regions 3b and the first p-type regions 3a form first p⁺ base regions 3. The dose used during the ion implantation process for forming the second p-type regions 3b may be set such that the resulting impurity concentration is approximately $5 \times 10^{18}/cm^3$, for example. Then, the mask used during the ion implantation process for forming the second p-type regions 3b is removed. Next, using ion implantation, n-type impurities such as nitrogen atoms are ion-implanted. In this way, second n-type regions (second regions of the first conductivity type) 5b with a depth of approximately 0.5 µm, for example, are formed in a portion of the surface layer of the second n-type silicon carbide epitaxial layer 2b and contact the first p-type regions 3a, the second p⁺ base regions 4, and the first n-type regions 5a. The dose used during the ion implantation process for forming the second n-type regions 5b may be set such that the resulting impurity concentration is approximately $1 \times 10^{17}/cm^3$, for example. Together, the second n-type regions 5b and the first n-type regions 5a form n⁺ high impurity concentration regions 5. FIG. 4 illustrates the state of the device up to this point.

Next, a p-type base layer (a wide-bandgap semiconductor layer of the second conductivity type) 6 is epitaxially grown to a thickness of approximately 1.3 µm, for example, on the surface of the n-type silicon carbide epitaxial layer 2 (that is, on the surfaces of the first p⁺ base regions 3 and the second n-type regions 5b) while doping with p-type impurities such as aluminum atoms, for example. The epitaxial growth conditions for forming the p-type base layer 6 may be set such that the resulting impurity concentration is approximately $4 \times 10^{17}/cm^3$, for example (which is lower than the impurity concentration of the first p+ base regions 3). The steps thus far form a silicon carbide semiconductor substrate, in which the n-type silicon carbide epitaxial layer 2 and the p-type base layer 6 are layered on top of the n+ silicon carbide substrate 1.

Figure 5:
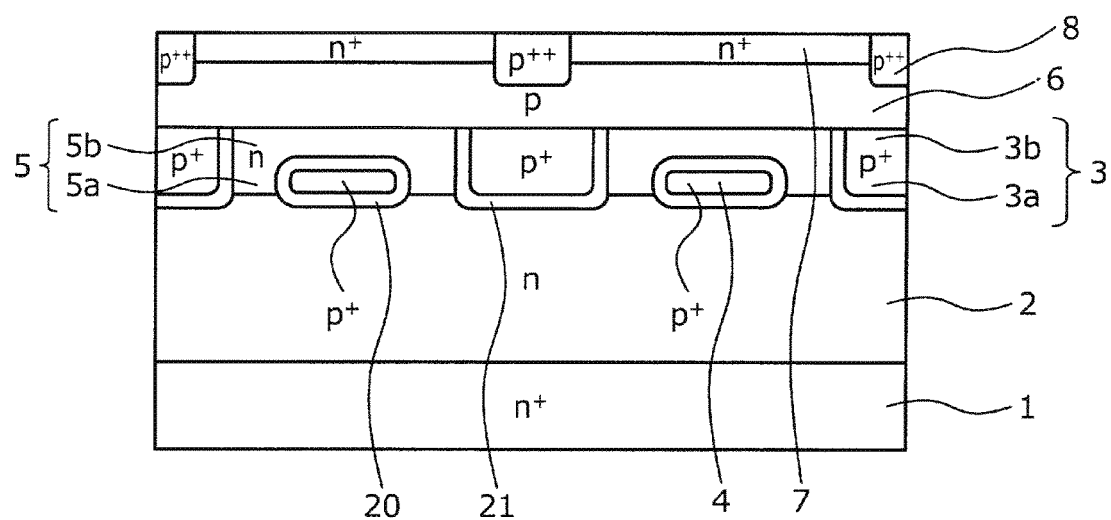
FIG. 5 is a cross-sectional view schematically illustrating a (fourth) state during the manufacture of the silicon carbide semiconductor device according to Embodiment 1.

Next, a mask (not illustrated in the figure) that is made of an oxide film, for example, and has the desired openings formed therein using a photolithography technology is formed on the surface of the p-type base layer 6. Then, using an ion implantation method with the oxide film being used as a mask, n-type impurities such as phosphorus are ion-implanted. In this way, n+ source regions (source regions of the first conductivity type) 7 are formed in portions of the surface layer of the p-type base layer 6. The dose used during the ion implantation process for forming the n+ source regions 7 may be set such that the resulting impurity concentration is greater than that of the first p+ base regions 3, for example. Then, the mask used during the ion implantation process for forming the n+ source regions 7 is removed. Next, a mask (not illustrated in the figure) that is made of an oxide film, for example, and has the desired openings formed therein using a photolithography technology is formed on the surface of the p-type base layer 6. Using this oxide film as a mask, p-type impurities such as aluminum are ion-implanted into the surface of the p-type base layer 6. In this way, p++ contact regions (contact regions of the second conductivity type) 8 are formed in portions of the surface layer of the p-type base layer 6. The dose used during the ion implantation process for forming the p++ contact regions 8 may be set such that the resulting impurity concentration is greater than that of the second p+ base regions 4, for example. Then, the mask used during the ion implantation process for forming the p++ contact regions 8 is removed. The order in which the ion implantation process for forming the n+ source regions 7 and the ion implantation process for forming the p++ contact regions 8 are performed may be reversed. FIG. 5 illustrates the state of the device up to this point.

Next, a heat treatment (annealing) is performed to activate the first p-type regions 3a, the second p-type regions 3b, the n+ source regions 7, and the p++ contact regions 8, for example. The temperature at which the heat treatment is performed may be approximately 1700° C., for example. The duration of the heat treatment may be approximately 2 minutes, for example. The heat treatment process may be performed one time to activate all of the ion-implanted regions at once as described above, or the heat treatment process may be performed after each ion implantation process.

Figure 6:
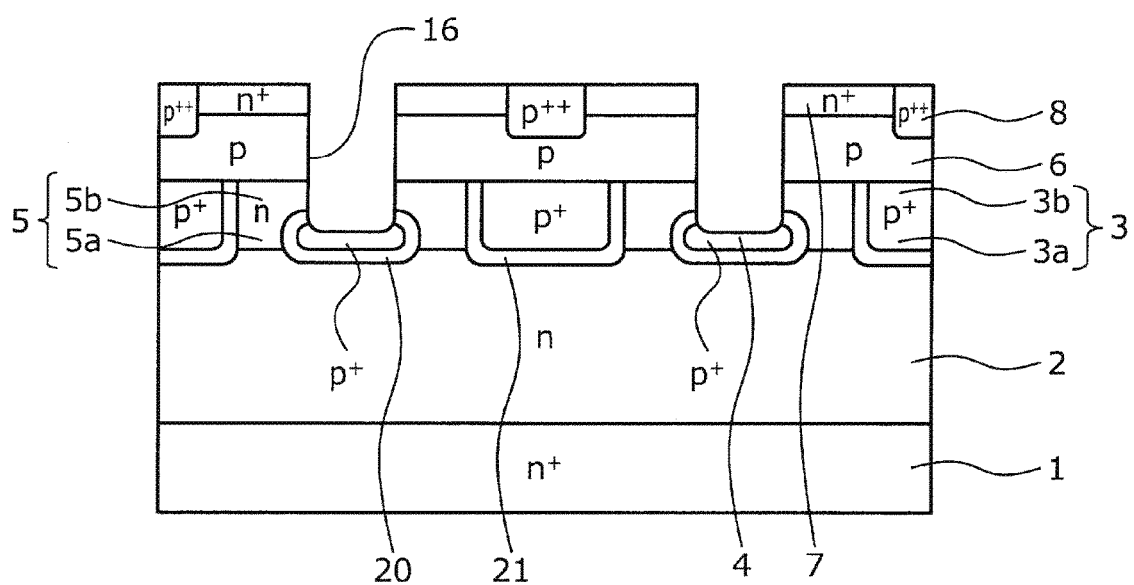
FIG. 6 is a cross-sectional view schematically illustrating a (fifth) state during the manufacture of the silicon carbide semiconductor device according to Embodiment 1.

Next, a mask (not illustrated in the figure) that is made of an oxide film, for example, and has the desired openings formed therein using a photolithography technology is formed on the surface of the p-type base layer 6 (that is, on the surfaces of the n+ source regions 7 and the p++ contact regions 8). Next, using a dry etching process or the like with the oxide film being used as a mask, trenches 16 are formed going down through the n+ source regions 7 and the p-type base layer 6 and into the n+ high impurity concentration regions 5. The bottom of the trenches 16 may extend into the second p+ base regions 4 or may be positioned in the n+ high impurity concentration regions 5 that are sandwiched between the p-type base layer 6 and the second p+ base regions 4. Then, the mask used to form the trenches 16 is removed. FIG. 6 illustrates the state of the device up to this point.

Next, a gate insulating film 9 is formed along the surfaces of the n+ source regions 7 and the p++ contact regions 8 and along the bottoms and sidewalls of the trenches 16. The gate insulating film 9 may be formed using a thermal oxidation process in which a heat treatment is performed in an oxygen atmosphere at a temperature of approximately 1000° C. Alternatively, the gate insulating film 9 may be formed by inducing a chemical reaction such as high temperature oxidation (HTO) to deposit the gate insulating film 9.

Next, a polycrystalline silicon layer doped with phosphorus atoms, for example, is formed on top of the gate insulating film 9. This polycrystalline silicon layer is formed filling the interiors of the trenches 16. This polycrystalline silicon layer is then patterned and left remaining only inside the trench 16, thereby forming gate electrodes 10. A portion of each gate electrode 10 may protrude upward from the top of the respective trench 16 (that is, on a source electrode pad 14 side) towards the source electrode pad 14 side.

Figure 7:
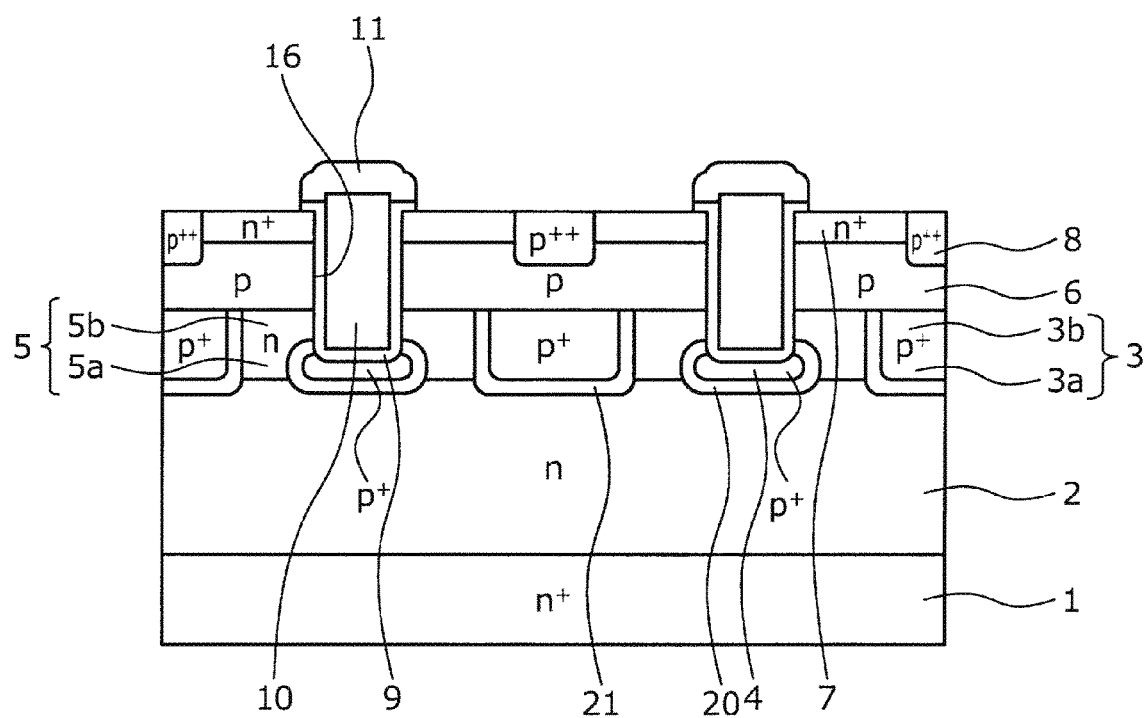
FIG. 7 is a cross-sectional view schematically illustrating a (sixth) state during the manufacture of the silicon carbide semiconductor device according to Embodiment 1.

Next, a phosphosilicate glass (PSG) film with a thickness of approximately 1 µm is formed covering the gate insulating film 9 and the gate electrodes 10 to form an interlayer insulating film 11. The interlayer insulating film 11 and the gate insulating film 9 are then selectively removed using a patterning process to form contact holes, thereby exposing the n+ source regions 7 and the p++ contact regions 8. Then, a heat treatment (reflow) is performed to planarize the interlayer insulating film 11. FIG. 7 illustrates the state of the device up to this point.

Next, a conductive film that functions as a source electrode 12 is formed inside the contact holes and on top of the interlayer insulating film 11. This conductive film is then selectively removed to leave the source electrode 12 remaining only inside of the contact holes, for example.

Next, a drain electrode 13 made of a nickel (Ni) film, for example, is formed on the second principal surface of the n+ silicon carbide substrate 1. Then, a heat treatment is performed at a temperature of approximately 970° C., for example, to form an ohmic contact between the n+ silicon carbide substrate 1 and the drain electrode 13.

Next, an aluminum film with a thickness of approximately 5 µm is formed covering the source electrode 12 and the interlayer insulating film 11 using a sputtering method, for example. Then, the aluminum film is selectively removed but left covering the entire active portion of the device, thereby forming the source electrode pad 14.

Next, titanium (Ti), nickel, and gold (Au), for example, are layered in that order onto the surface of the drain electrode 13 to form a drain electrode pad 15. This completes the semiconductor device illustrated in FIG. 1.

Working Example

Figure 8:
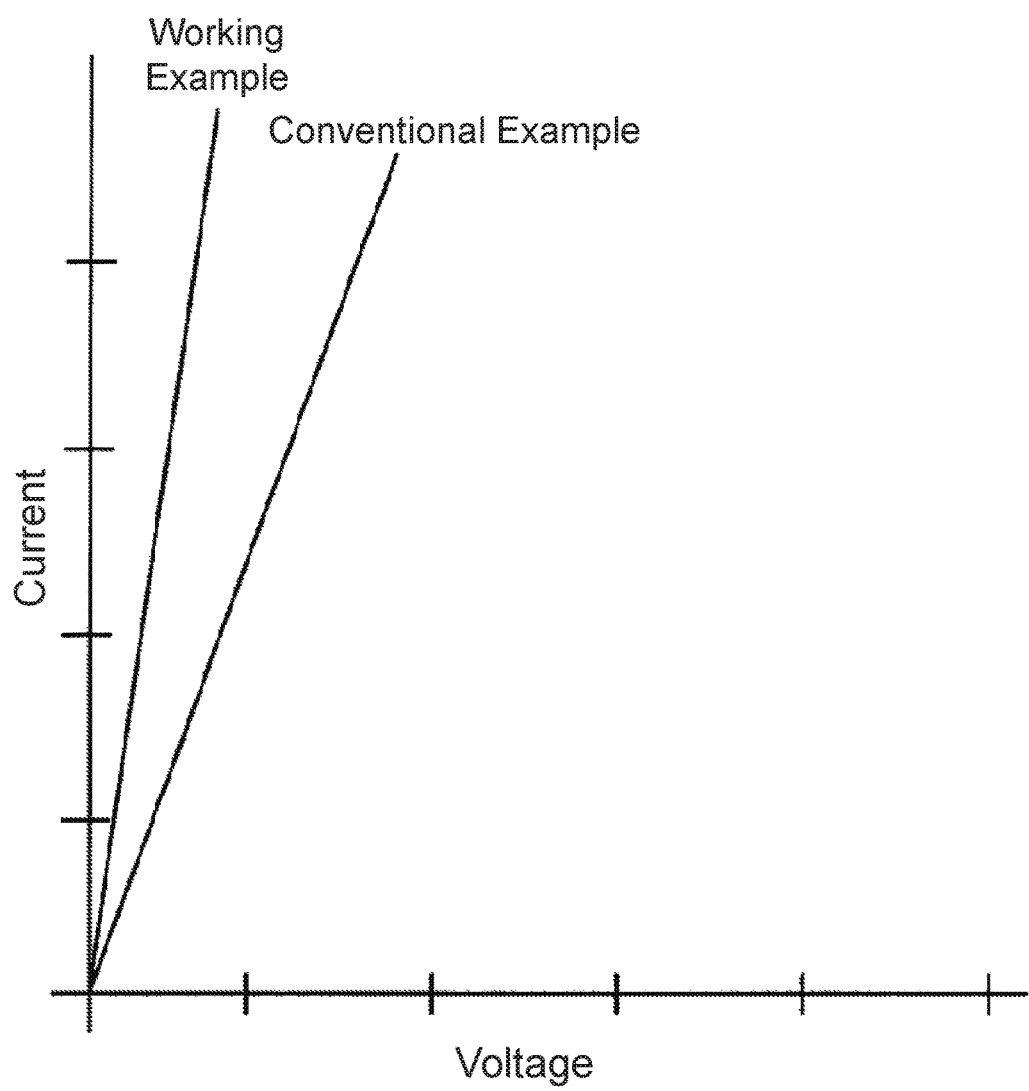
FIG. 8 is a graph comparing the current-voltage characteristics of the silicon carbide semiconductor device according to Embodiment 1 and the current-voltage characteristics of a conventional silicon carbide semiconductor device.
Figure 9:
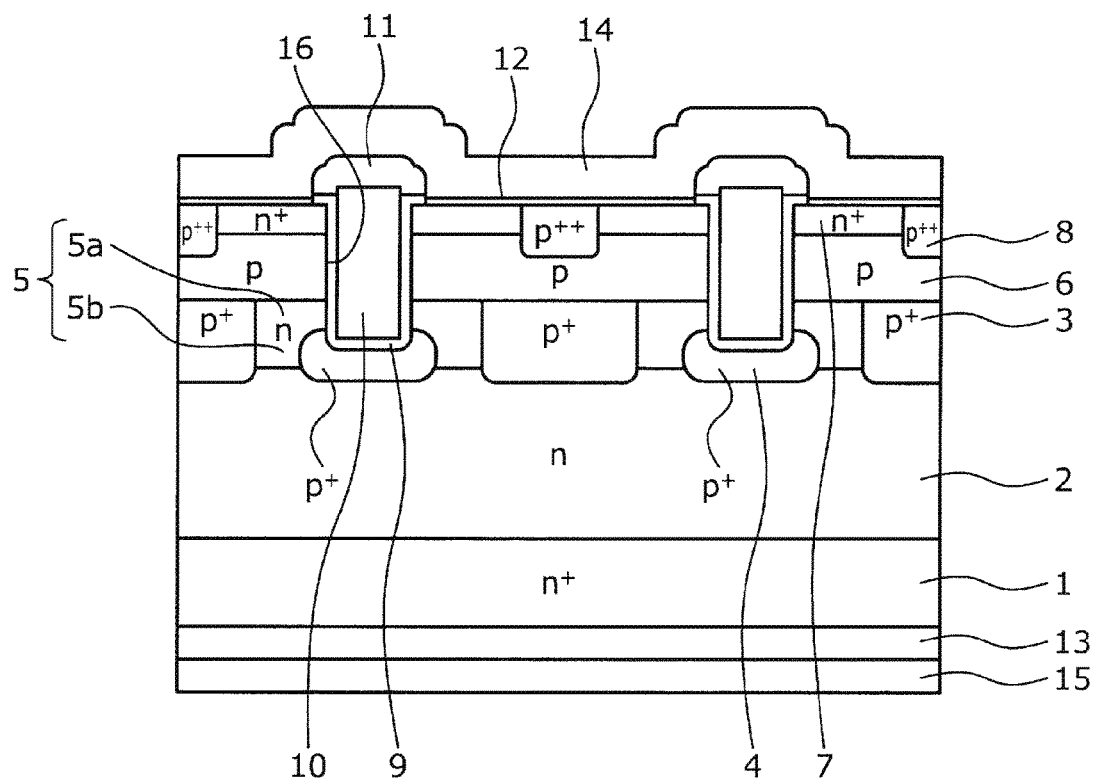
FIG. 9 is a cross-sectional view illustrating a configuration of a conventional silicon carbide semiconductor device.

FIG. 8 is a graph comparing the current-voltage characteristics of the silicon carbide semiconductor device according to Embodiment 1 and the current-voltage characteristics of a conventional silicon carbide semiconductor device. FIG. 9 is a cross-sectional view illustrating a configuration of the conventional silicon carbide semiconductor device. The conventional silicon carbide semiconductor device is a vertical trench-gate MOSFET in which the first n-type regions 20 and the second n-type regions 21 of the silicon carbide semiconductor device according to Embodiment 1 are removed.

FIG. 8 is a graph in which the current that flows through the drain electrode 13 and the source electrode 12 in the ON state is plotted against the voltage between the drain electrode 13 and the source electrode 12. In FIG. 8, the horizontal axis is the voltage, and the vertical axis is the current. The line labeled "Working Example" represents the current-voltage characteristics of the silicon carbide semiconductor device according to Embodiment 1, and the line labeled "Conventional Example" represents the current-voltage characteristics of the conventional example silicon carbide semiconductor device.

In the working example, the slope of the current-voltage line is greater than in the conventional example. For a given increase in voltage, a greater increase in current is achieved in the working example than in the conventional example, and the resistance is also smaller. Therefore, on-resistance of the working example is less than the on-resistance of the conventional example.

Embodiment 1 was described using an example in which the second n-type regions $5b$ are formed using ion implantation. However, the second n-type regions $5b$ may instead be formed as part of forming the second n-type silicon carbide epitaxial layer $2b$. In other words, during the process for epitaxially growing the second n-type silicon carbide epitaxial layer $2b$, the nitrogen impurity concentration may be set to the appropriate impurity concentration for the second n-type regions $5b$, and the ion implantation process may be omitted. Moreover, the silicon carbide semiconductor substrate may be constituted by the $n^+$ silicon carbide substrate 1 and the n-type silicon carbide epitaxial layer 2, and the p-type base layer 6 may be formed in the surface layer on the substrate first principal surface side of the n-type silicon carbide epitaxial layer 2 using ion implantation. Alternatively, the silicon carbide semiconductor substrate may be constituted by just the $n^+$ silicon carbide substrate 1, and all of the regions of the MOS gate structures (the $n^+$ high impurity concentration regions 5, the first and second p-type base regions 3 and 4, and the third and fourth n-type regions 20 and 21) may be formed in the surface layer on the first principal surface side of the $n^+$ silicon carbide substrate 1 using ion implantation.

As described above, in Embodiment 1, the third n-type regions that surround the first $p^+$ base regions contacting the p-type base layer and have a higher impurity concentration than the n-type drift layer, as well as the fourth n-type regions that surround the second $p^+$ base regions formed at the bottoms of the trenches and also have a higher impurity concentration than the n-type drift layer, are formed in the n-type drift layer. This makes it possible to make the concentration of n-type impurities in the portion of the high impurity concentration n-type drift layer that is sandwiched between the first $p^+$ base regions and the second $p^+$ base regions relatively high in comparison with other portions of the high impurity concentration n-type drift layer. This, in turn, makes it possible to reduce the resistance component from the JFET regions, thereby making it possible to reduce the overall on-resistance.

Moreover, in Embodiment 1, forming the first $p^+$ base regions that contact the p-type base layer makes it possible to form the p-n junction between the first $p^+$ base regions and the n-type drift layer at a position between adjacent trenches that is closer to the drain side than the bottoms of the trenches. Furthermore, forming the second $p^+$ base regions in the n-type drift layer such that the second $p^+$ base regions either surround the bottoms of the trenches or are positioned deeper than the bottoms of the trenches and face the trenches in the depth direction makes it possible to form the p-n junction between the second $p^+$ base regions and the n-type drift layer at a position close to the bottoms of the trenches. Forming p-n junctions between the n-type drift layer and the first and second p-type base regions in this way makes it possible to prevent a strong electric field from being applied to the gate insulating film at the bottoms of the trenches. This makes it possible to achieve increased breakdown voltage even when a wide-bandgap semiconductor is used as the semiconductor material. Moreover, forming the second $p^+$ base regions to have a width greater than the width of the trenches makes it possible to reduce the magnitude of the electric field at the corners at the bottoms of the trenches, thereby making it possible to further increase the breakdown voltage.

Furthermore, in Embodiment 1, extending a portion of the first $p^+$ base regions towards the trench sides and connecting that portion to the second $p^+$ base regions makes it possible to efficiently divert any holes created due to avalanche breakdown at the junction between the second $p^+$ base regions and the n-type silicon carbide epitaxial layer to the source electrode. This makes it possible to reduce the on-resistance while maintaining a high breakdown voltage. Moreover, in Embodiment 1, forming the second $p^+$ base regions to have a width greater than the width of the trenches results in each second $p^+$ base region being arranged surrounding at least one of the corners at the bottom of the respective trench even if misalignments occur between the trenches and the second $p^+$ base regions in the horizontal direction. This makes it possible to provide a semiconductor device in which the maximum magnitude of the electric field applied to the gate insulating film is greater than in conventional technologies while the on-resistance is maintained at approximately the same level as in conventional technologies. As a result, a semiconductor device with a high breakdown voltage and a low on-resistance can be manufactured using a method of manufacturing that includes epitaxial growth and ion implantation or only ion implantation and is simpler than conventional technologies.

Embodiment 2

Figure 10:
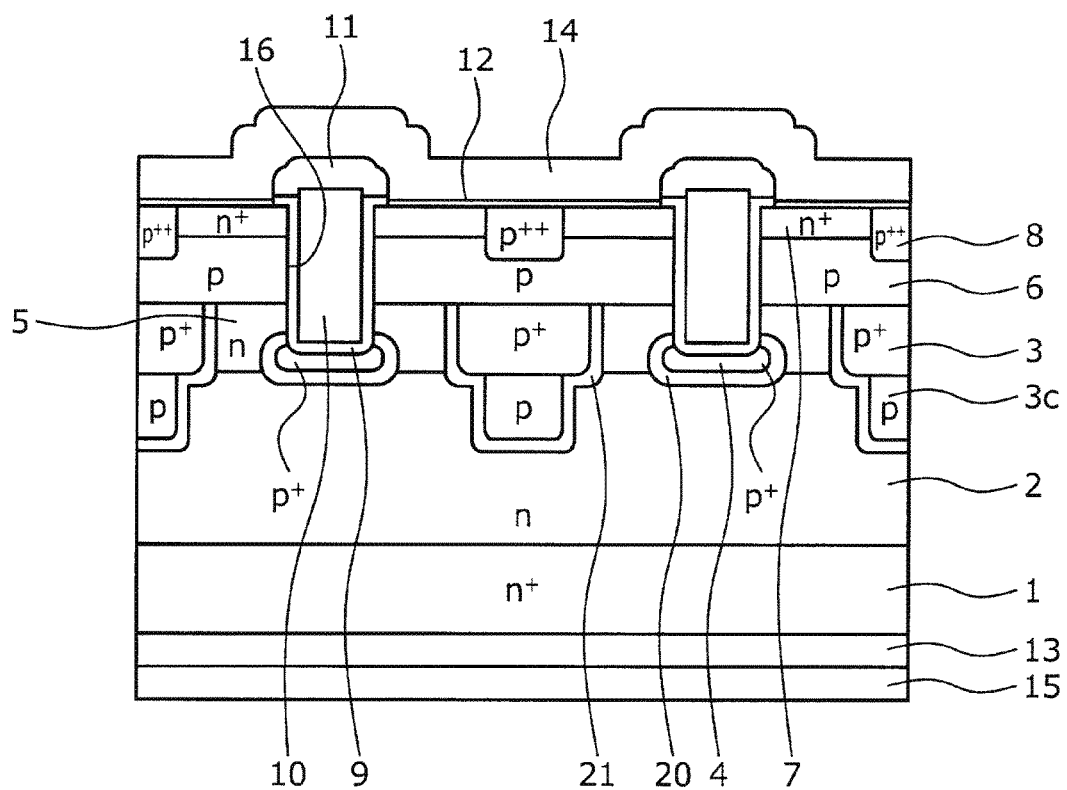
FIG. 10 is a cross-sectional view illustrating a configuration of a silicon carbide semiconductor device according to Embodiment 2.

FIG. 10 is a cross-sectional view illustrating a configuration of a silicon carbide semiconductor device according to Embodiment 2. As illustrated in FIG. 10, the silicon carbide semiconductor device according to Embodiment 2 is a structure in which third p-type regions $3c$ are formed contacting the bottom ends (drain side ends) of first $p^+$ base regions 3 in an n-type silicon carbide epitaxial layer 2 and in which fourth n-type regions 21 surround the third p-type regions $3c$. Together, the third p-type regions $3c$, a p-type base layer 6, and the first $p^+$ base regions 3 function as base regions.

The thickness of the third p-type regions $3c$ may be approximately 0.1 μm to 0.5 μm, for example. The width of the third p-type regions $3c$ is less than the width of the first $p^+$ base regions 3 and may be 0.1 μm or more less than the width of the first $p^+$ base regions 3, for example. Moreover, the third p-type regions $3c$ may be formed continuously and with the same thickness running in the sidewall direction of the first $p^+$ base regions 3 and in the direction parallel to the surface of an $n^+$ silicon carbide substrate 1, or the third p-type regions $3c$ may be formed having a periodic dot-shaped structure when viewed from above from the $n^+$ silicon carbide substrate 1 side.

The rest of the configuration of the silicon carbide semiconductor device according to Embodiment 2 is the same as the configuration of the silicon carbide semiconductor device according to Embodiment 1, and therefore a redundant description will be omitted here.

Method of Manufacturing Silicon Carbide Semiconductor Device According to Embodiment 2

Figure 11:
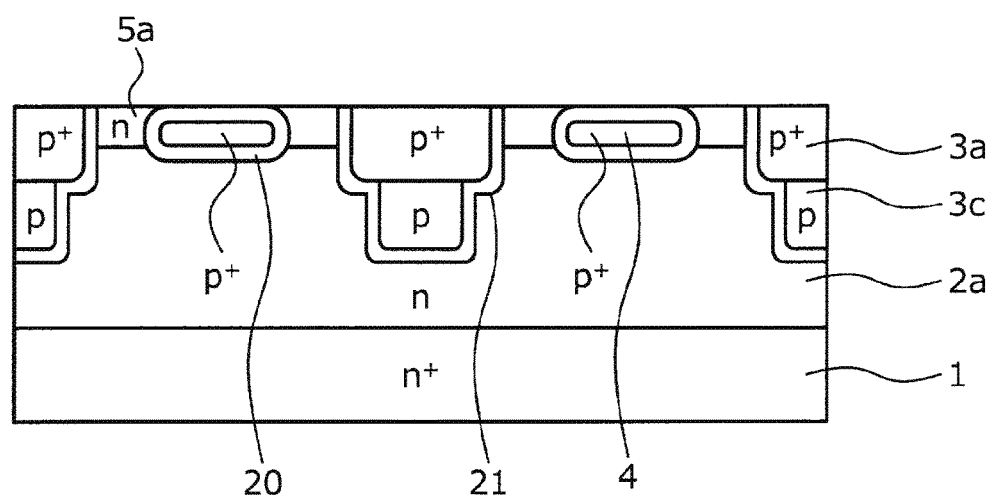
FIG. 11 is a cross-sectional view schematically illustrating a state during the manufacture of the silicon carbide semiconductor device according to Embodiment 2.

FIG. 11 is a cross-sectional view schematically illustrating a state during the manufacture of the silicon carbide semiconductor device according to Embodiment 2. As illustrated in FIG. 11, after forming first p-type regions 3a, second p+ base regions 4, first n-type regions 5a, third n-type regions 20, and the fourth n-type regions 21, the masks used during the ion implantation processes are removed. Then, a mask (not illustrated in the figure) that is made of a resist, for example, and has the desired openings formed therein using a photolithography technology is formed on the surface of a first n-type silicon carbide epitaxial layer 2a. Then, using an ion implantation method with the resist being used as a mask, n-type impurities such as phosphorus atoms are ion-implanted to selectively invert portions of the first p-type regions 3a and the first n-type silicon carbide epitaxial layer 2a to n-type portions, thereby forming n-type regions (not illustrated in the figure) that contact the fourth n-type regions 21. Next, the mask used during formation of the n-type regions that contact the fourth n-type regions 21 is removed, and another mask made of a resist is formed, for example. Then, using an ion implantation method with the resist being used as a mask, p-type impurities such as aluminum atoms are ion-implanted to selectively invert portions of the n-type regions to p-type regions. The regions that were selectively inverted to p-type regions become the first p-type regions 3a and the third p-type regions 3c, and the regions that were not inverted to p-type regions become the fourth n-type regions 21. In this way, as illustrated in FIG. 11, the third p-type regions 3c are formed beneath the first p-type regions 3a (on the drain side end thereof) such that the third p-type regions 3c contact the first p-type regions 3a, are surrounded by the respective fourth n-type regions 21, and have a thickness of approximately 0.25 µm and a width of approximately 1 µm, for example. The ion energy used during formation of the third p-type regions 3c may be set to 700 keV, and the dose may be set to approximately $1\times10^{14}/cm^2$, for example.

The rest of the method of manufacturing the silicon carbide semiconductor device according to Embodiment 2 is the same as the method of manufacturing the silicon carbide semiconductor device according to Embodiment 1, and therefore a redundant description will be omitted here.

As described above, Embodiment 2 achieves the same advantageous effects as in Embodiment 1. Moreover, in Embodiment 2, forming at least portions (the third p-type regions) of the bottom ends of the first p+ base regions at a position deeper than the bottom ends of the second p+ base regions allows current to flow from the source regions through the third p-type regions and to the drain side when avalanche breakdown occurs. This makes it possible to further reduce the magnitude of the electric field applied to the gate insulating film at the bottoms of the trenches.

In the present invention as described above, a configuration in which the (0001) plane of a silicon carbide substrate made of silicon carbide was designated as the first principal surface and a MOS gate structure was formed on that (0001) plane was described as an example. However, the present invention is not limited to this example, and various modifications may be made in terms of the type of wide-bandgap semiconductor used (such as gallium nitride (GaN), for example), the orientation of the plane designated as the principal surface of the substrate, or the like. Additionally, in each of the embodiments of the present invention described above, the first conductivity type was n-type and the second conductivity type was p-type. However, the present invention still exhibits all of the same advantageous effects if the first conductivity type is p-type and the second conductivity type is n-type.

INDUSTRIAL APPLICABILITY

As described above, the semiconductor device according to the present invention is suitable for use in high breakdown voltage semiconductor devices used in power converters, power supplies for various types of industrial machinery, or the like. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    a wide-bandgap semiconductor substrate of a first conductivity type made of a semiconductor having a wider bandgap than silicon;
    a wide-bandgap semiconductor layer of the first conductivity type that is formed on a front surface of the wide-bandgap semiconductor substrate and that is made of the semiconductor having a wider bandgap than silicon, said wide-bandgap semiconductor layer having a lower impurity concentration than the wide-bandgap semiconductor substrate;
    a first base region of a second conductivity type that is selectively formed in a surface layer of the wide-bandgap semiconductor layer of the first conductivity type on a side opposite to the wide-bandgap semiconductor substrate;
    a second base region of the second conductivity type that is selectively formed inside the wide-bandgap semiconductor layer of the first conductivity type;
    a first region of the first conductivity type that is selectively formed in the surface layer of the wide-bandgap semiconductor layer of the first conductivity type on the side opposite to the wide-bandgap semiconductor substrate and that has a higher impurity concentration than the wide-bandgap semiconductor layer of the first conductivity type, the first region being located between the first base region and the second base region;
    a wide-bandgap semiconductor layer of the second conductivity type that is made of the semiconductor having a wider bandgap than silicon and that is formed on a surface of the wide-bandgap semiconductor layer of the first conductivity type opposite to the wide-bandgap semiconductor substrate;
    a source region of the first conductivity type that is selectively formed in the surface of the wide-bandgap semiconductor layer of the second conductivity type;
    a trench that goes through the source region and the wide-bandgap semiconductor layer of the second conductivity type, the trench reaching the first region and the second base region in the wide-bandgap semiconductor layer of the first conductivity type so that the second base region is at a bottom of the trench;
    a gate electrode formed inside the trench with a gate insulating film interposed therebetween;
    a source electrode that contacts the source region and the wide-bandgap semiconductor layer of the second conductivity type; and
    a drain electrode formed on a rear surface of the wide-bandgap semiconductor substrate, wherein the first base region is electrically connected to the second base region, and wherein a second region of the first conductivity type and a third region of the first conductivity type, each having a higher impurity concentration than the first region, are selectively formed in the wide-bandgap semiconductor layer of the first conductivity type such that the second region partially surrounds the second base region, and the third region partially surrounds the first base region.

2. The semiconductor device according to claim 1, wherein a width of the second base region is greater than a width of the trench.

3. The semiconductor device according to claim 1, wherein the second base region and the second region do not contact the trench.

4. The semiconductor device according to claim 1, wherein the first region extends between the wide-bandgap semiconductor layer of the second conductivity type and a section connecting a portion of the first base region to the second base region.

5. The semiconductor device according to claim 1, wherein a section connecting a portion of the first base region to the second base region sandwiches the first region and has a planar layout in which said section is periodically arranged in a direction orthogonal to a direction in which the first base region and the second base region are arranged.

6. The semiconductor device according to claim 1, wherein at least a portion of an end of the first base region on a side of the drain electrode is positioned further towards the drain electrode than an end of the second base region on the side of the drain electrode.

7. The semiconductor device according to claim 1, wherein a portion of an end of the first base region on a side of the drain electrode that is deeper than an end of the second base region on the side of the drain electrode has a planar layout in which said portion is periodically arranged in a direction orthogonal to a direction in which the first base region and the second base region are arranged.

8. The semiconductor device according to claim 1, wherein the semiconductor having a wider bandgap than silicon is silicon carbide.

9. A method of manufacturing a semiconductor device, comprising:

forming, on a front surface of a wide-bandgap semiconductor substrate of a first conductivity type made of a semiconductor having a wider bandgap than silicon, a wide-bandgap semiconductor layer of the first conductivity type that is made of the semiconductor having a wider bandgap than silicon and that has a lower impurity concentration than the wide-bandgap semiconductor substrate;

selectively forming, in a surface layer of the wide-bandgap semiconductor layer of the first conductivity type on a side opposite to the wide-bandgap semiconductor substrate, a first region of the first conductivity type that has a higher impurity concentration than the wide-bandgap semiconductor layer of the first conductivity type;

selectively forming, in the surface layer of the wide-bandgap semiconductor layer of the first conductivity type, a first base region of a second conductivity type, a second base region of the second conductivity type, a third region of the first conductivity type that partially surrounds the first base region, and a second region of the first conductivity type that partially surrounds the second base region;

forming, on a surface of the wide-bandgap semiconductor layer of the first conductivity type opposite to the wide-bandgap semiconductor substrate, a wide-bandgap semiconductor layer of the second conductivity type that is made of the semiconductor having a wider bandgap than silicon;

selectively forming a source region of the first conductivity type in the surface of the wide-bandgap semiconductor layer of the second conductivity type;

forming, at a position facing the second base region of the second conductivity type in a depth direction, a trench that goes through the source region of the first conductivity type and the wide-bandgap semiconductor layer of the second conductivity type to reach the first region and the second base region in the wide-bandgap semiconductor layer of the first conductivity type so that the second base region is at a bottom of the trench;

forming a gate electrode inside the trench with a gate insulating film interposed therebetween;

forming a source electrode that contacts the wide-bandgap semiconductor layer of the second conductivity type and the source region of the first conductivity type; and forming a drain electrode on a rear surface of the wide-bandgap semiconductor substrate.

10. The method of manufacturing the semiconductor device according to claim 9, wherein a surface portion of the first region on a side opposite to the wide-bandgap semiconductor substrate is formed by being epitaxially grown.

* * * * *